(12) United States Patent
Bayer

(10) Patent No.: US 7,129,752 B2
(45) Date of Patent: Oct. 31, 2006

(54) HIGH-SPEED LEVER SHIFTER WITH AC FEED-FORWARD

(75) Inventor: Erich Bayer, Thonhausen (DE)

(73) Assignee: Texas Instruments Incorporated, Dallas, TX (US)

( * ) Notice: Subject to any disclaimer, the term of this patent is extended or adjusted under 35 U.S.C. 154(b) by 94 days.

(21) Appl. No.: 11/042,297

(22) Filed: Jan. 24, 2005

(65) Prior Publication Data

US 2005/0169027 A1 Aug. 4, 2005

(51) Int. Cl.
*H03K 19/0175* (2006.01)
(52) U.S. Cl. .......................................... 326/68; 326/63
(58) Field of Classification Search ................. 326/62, 326/63, 68–74
See application file for complete search history.

(56) References Cited

U.S. PATENT DOCUMENTS

| | | | |
|---|---|---|---|
| 4,703,199 A | 10/1987 | Ely | |
| 5,732,249 A | 3/1998 | Masuda et al. | |
| 6,201,429 B1 | 3/2001 | Rosenthal | |
| 2002/0080651 A1* | 6/2002 | Tanzawa et al. | 365/185.18 |
| 2003/0107425 A1* | 6/2003 | Yushan | 327/333 |
| 2006/0012415 A1* | 1/2006 | Chen | 327/333 |

FOREIGN PATENT DOCUMENTS

DE 102 46 083 B3 3/2004

* cited by examiner

*Primary Examiner*—Don Le
(74) *Attorney, Agent, or Firm*—W. James Brady, III; Frederick J. Telecky, Jr.

(57) ABSTRACT

An improved level shifter circuit with AC feed-forward is disclosed. The integrated circuit device includes a first circuit part biased from a lower voltage supply and a second circuit part biased from a higher voltage supply. One of the circuit parts has an RS flip-flop with two complementary signal outputs and the other one has a signal input and a first and a second switching transistor. The first and the second switching transistors each have a current channel DC coupled in series with a respective cascode-connected transistor which is connected to a respective one of the signal outputs. One of these outputs is coupled to the input through a first feed-forward AC series circuit of an inverter and a first coupling capacitor, and the other output is coupled to the input through a second feed-forward AC circuit including a second coupling capacitor.

3 Claims, 1 Drawing Sheet

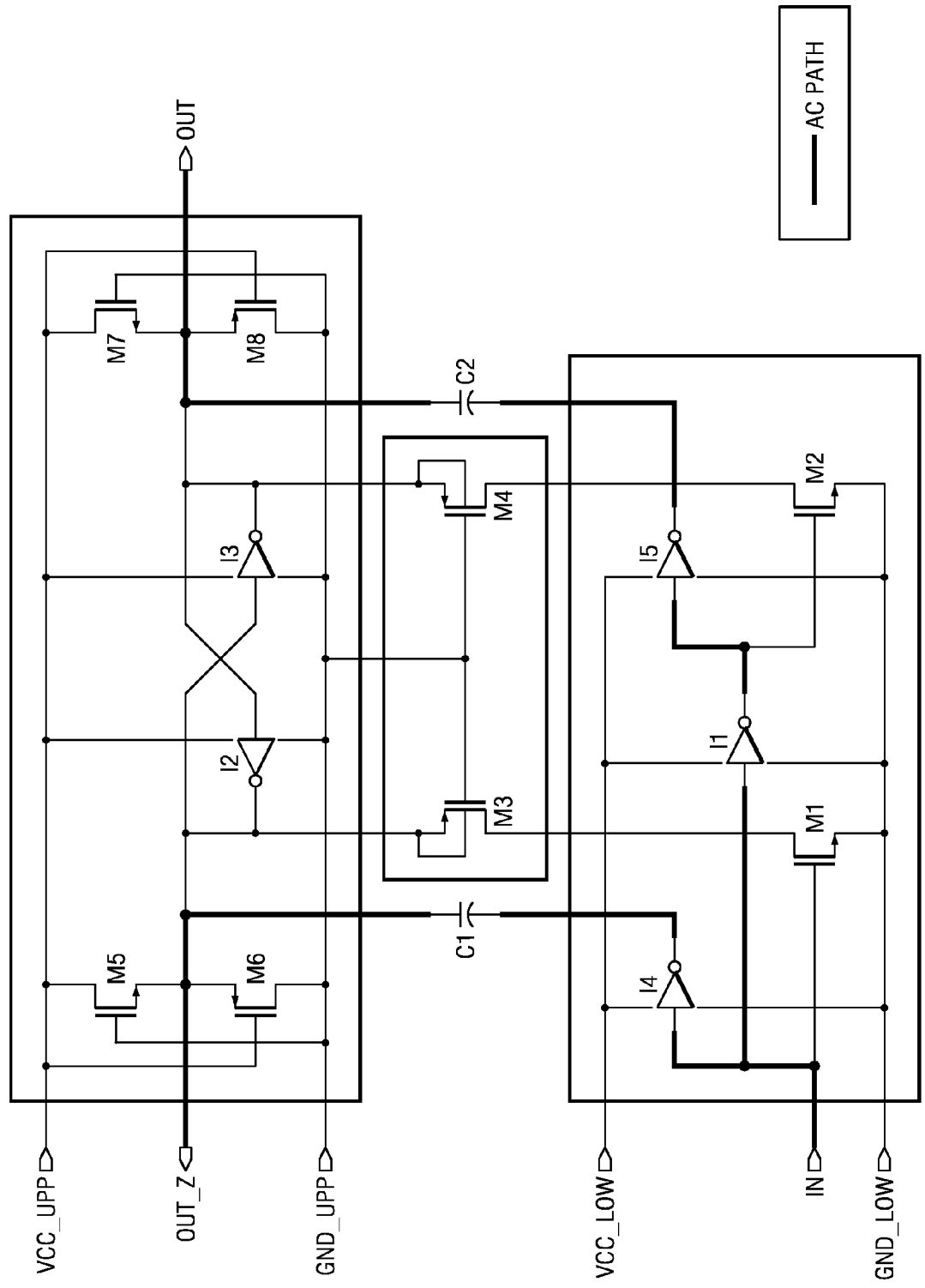

HIGH-SPEED LEVER SHIFTER WITH AC FEED-FORWARD

CROSS REFERENCE TO RELATED APPLICATIONS

This application claims priority under 35 USC § 119 of German Application Serial No. 102004004271.3, filed Jan. 28, 2004.

FIELD OF THE INVENTION

The present invention relates to an integrated circuit device having a first circuit part biased from a lower supply voltage and a second circuit part biased from a higher supply voltage.

BACKGROUND OF THE INVENTION

Integrated circuit (IC) devices with positive and negative supply, IC devices with separate circuit parts biased from first and second supplies, respectively, that have a common reference, or circuits with a supply voltage higher than a maximum permissible gate-to-source voltage of a MOS transistor within the device, typically need a signal level shifter circuit communicating an input signal received at an input of one of the first and second circuit parts to an output of the other circuit part. In the present disclosure, assuming the case of a first supply with a Ground terminal referred to as "GND" and a supply terminal referred to as VCC (a usual convention in IC circuits), and a second supply also with a Ground terminal "GND" and a supply terminal "VCC", the second supply being referenced to the GND terminal of the first supply and having a voltage level higher than the voltage level of the first supply, the lower supply has supply terminals referred to as GND_LOW and VCC_LOW, and the upper supply has supply terminals referred to as GND_UPP and VCC_UPP. In a configuration with positive and negative supplies that have a common GND terminal, similar designations would be used mutatis mutandis.

A signal level shifter should transfer a ground-referenced DC signal to a DC signal referenced to the VCC terminal, a VCC referenced DC signal to a Ground referenced DC signal, or a DC signal referenced to any terminal of a first supply to a DC signal referenced to any terminal of a second supply. Standard DC signal level shifters in integrated MOS, CMOS or BiCMOS circuits have a relatively high propagation delay, especially when cascode stages are needed for blocking excessive voltages between circuit parts or circuit components.

SUMMARY OF THE INVENTION

The present invention provides an integrated circuit device with a signal level shifter that achieves a minimized propagation delay with a simple circuit configuration. Specifically, the integrated circuit device of the invention has a first circuit part that is biased from a lower voltage supply and a second circuit part being biased from a higher voltage supply. One of the first and second circuit parts has an RS flip-flop with complementary signal outputs, and the other of the first and second circuit parts has a signal input and comprises a first switching transistor with a gate connected to the signal input and a second switching transistor with a gate connected to the signal input through an inverter. The first and second switching transistors have each a current channel DC coupled in series with a respective cascode-connected transistor connected to a respective one of the signal outputs. One of these outputs is coupled with the input through a first feed-forward AC series circuit of an inverter and a first coupling capacitor. The other output is coupled with the signal input through a second feed-forward AC circuit, that includes a second coupling capacitor. In this way, the integrated circuit device has a DC path between the input and the signal output and another DC path between the input and the complementary output, each DC path being formed of one of the first and second switching transistors and a respective cascode-connected transistor. In parallel to each DC path is a feed-forward AC path with a coupling capacitor. Provided that these capacitors are much bigger than the parasitic capacitors on the outputs of the flip-flop, the speed increases dramatically since for transient signals the capacitors can be seen as low impedance shorts. On the other hand, for DC the capacitors act as "offset-voltage" sources. The propagation delay is limited to one or two inverter delays in the AC path. The signals at the outputs of the integrated circuit device follow directly the signals on the AC paths even before the flip-flop has changed its state. The full output voltage swing of an inverter in the AC path can be transferred to the outputs.

With the AC paths in parallel to the DC paths, the AC output impedance is much lower than would be the AC output impedance with DC paths only. With DC paths only, the output impedance is given by the series circuit of two transistors: a switching transistor and a cascode-connected transistor. With the inventive circuit device, the outputs of the flip-flop can now be pulled against ground or pushed against the supply voltage of the circuit part which comprises the flip-flop with the low output impedance of the AC paths. Without the feed-forward AC paths, the DC paths must have a low enough impedance to over-run the flip-flop. When there is no special bias for the cascode transistors, this is very difficult to reach. When for a signal shifter from a lower to a higher level the gates of the cascode transistors are biased to the upper ground level, the cascode has almost no gate-source voltage minus threshold voltage to drive one of the flip-flop outputs towards this upper ground level. This means that the cascode transistors must be large. Additionally to avoid increase of the threshold voltage by the body effect of these transistors, their back-gates must be connected to the source, what increases the capacitance on the outputs of the flip-flop, which additionally must be charged or discharged from the cascode outputs. The DC paths are consequently relatively slow.

In a preferred embodiment, each of the outputs is connected to an interconnection node of a complementary transistor pair which is connected in series between first and second supply terminals of a respective supply voltage. Each complementary transistor pair has a first transistor with a gate connected to the first supply terminal and a second transistor which has its gate connected to the second supply terminal. These transistor pairs form so-called clamp circuits that avoid latch-up of the flip-flop during the time when the capacitors in the AC paths are charged to their DC voltages or when the difference between the values of the lower voltage supply and the higher voltage supply is very important. Each complementary transistor pair avoids latch-up at a respective flip-flop output. If the voltage at a flip-flop output is the value of one threshold voltage Vt above its supply voltage or the value of one threshold voltage Vt under ground level one of the transistors will clamp the voltage.

BRIEF DESCRIPTION OF THE DRAWINGS

FIG. 1 is a diagram of the inventive integrated circuit device.

DETAILED DESCRIPTION OF THE DRAWINGS

With reference to FIG. 1 according to a specific embodiment an integrated circuit device with a signal level shifter comprises a first circuit part with a lower supply voltage terminal VCC_LOW and a lower ground terminal GND_LOW and a second circuit part with an upper supply voltage terminal VCC_UPP and an upper ground terminal GND_UPP. A signal input IN is provided in the first circuit part. Complementary signal outputs OUT and OUT_Z are provided in the second circuit part. The first circuit part comprises two NMOS switching transistors M1 and M2 and three inverters I1, I4 and I5. The second circuit part comprises two complementary transistor pairs M5/M6 and M7/M8 as well as two inverters I2 and I3. The two circuit parts are connected by a cascode arrangement with two PMOS transistors M3 and M4, and by two capacitors C1 and C2.

The NMOS switching transistors M1 and M2 have their sources connected to the ground terminal GND_LOW. Input IN is connected directly to the gate of transistor M1, while it is connected via inverter I1 to the gate of transistor M2. The input IN is connected via an AC-path including the inverter I4 and the capacitor C1 to the output OUT_Z; the input IN is also connected via an AC-path, including inverters I1 and I5 and capacitor C2, to output OUT. The inverters I1, I4 and I5 are biased by lower supply voltage VCC_LOW. The drain of transistor M1 is connected via cascode transistor M3 to output OUT_Z; and the drain of transistor M2 is connected via cascode transistor M4 to output OUT. Transistors M3 and M4 are interconnected at their gates and connected to upper ground terminal GND_UPP. The back-gates of transistors M3 and M4 are connected to their respective sources.

In the second circuit part, inverters I2 and I3 are cross-coupled to form a RS flip-flop with complementary outputs. The output of inverter I2 is connected to output OUT_Z; and the output of inverter I3 is connected to output OUT. The inverters I2 and I3 are biased by the upper supply voltage VCC_UPP. NMOS transistor M5 is connected in series with PMOS transistor M6 between the supply terminals VCC_UPP and GND_UPP. The interconnection node between their sources is connected to output OUT_Z. The gate of transistor M5 is connected to supply terminal GND_UPP; and the gate of transistor M6 is connected to supply terminal VCC_UPP. In the same way, NMOS transistor M7 is connected in series with PMOS transistor M8 between the supply terminals VCC_UPP and GND_UPP. The interconnection node between their sources is connected to output OUT. The gate of transistor M7 is connected to supply terminal GND_UPP; and the gate of transistor M8 is connected to supply terminal VCC_UPP.

In operation, a change from low level to high level at input IN is transmitted by the feed-forward AC circuits directly to both outputs. In the AC path between input IN and output OUT_Z, inverter I4 changes the polarity of the input signal. For a transient signal, capacitor C1 represents a short, so that the input signal is transmitted inverted to output OUT_Z, and OUT_Z is set to low. The time needed for the transmission is the delay time of inverter I4, only. Likewise, for a transient signal, capacitor C2 in the AC path between input IN and output OUT represents a short and the input signal is inverted by inverter I1 and again by inverter I5, so that there is no change in polarity at output OUT, OUT=high. The signal delay time is the delay time of inverter I1 and of inverter I5, only.

Of course, the input signal is transmitted on the DC paths as well. A high level on input IN turns transistor M1 on, so that the drain voltage of transistor M1 is forced to the voltage level GND_LOW. As the input signal is transmitted to the gate of transistor M2 through inverter I1, transistor M2 is turned off. As the switching transistor M1 is DC coupled in series with the cascode-connected transistor M3 to the output of inverter I2, this output is forced to low level. The switching transistor M2 being DC coupled in series with the cascode-connected transistor M4 to the output of inverter I3, so this output is permitted to assume a high level. When the voltage on the output of I2 is forced lower than the input threshold of inverter I1, the RS flip-flop changes state to OUT=high and OUT_Z=low. The clamp circuits formed by the transistors M5 and M6 for inverter I2 and M7 and M8 for inverter I3 are just needed to avoid latch-up of the inverters during that time when capacitors C1 and C2 are charged to their DC voltages or when the value of supply voltage VCC_LOW is much larger than supply voltage VCC_UPP. When the voltage at the output of inverter I2 is one threshold voltage Vt above supply voltage VCC_UPP, transistor M6 clamps the voltage. If the voltage at the output of inverter I2 is one threshold voltage Vt below ground level GND_UPP, transistor M5 clamps the voltage. Transistors M7 and M8 work in the same way for inverter I3. When the body diodes of the PMOS and NMOS transistors in the inverters I2 and I3 are isolated well enough to avoid substrate injection, there is no need for the clamp circuits.

The operation of the inventive circuit was explained in detail for an input signal from low to high level. With a change from high to low level at the input, operation is principally the same and output OUT changes to "low" and the complementary output OUT_Z to "high". Of course, the circuit may use switching PMOS transistors instead of NMOS transistors M1 and M2 for a signal shift from an upper supply voltage level to a lower supply voltage level.

The invention claimed is:

1. An integrated circuit device comprising:
   a first circuit part biased from a lower voltage supply VCC_LOW;
   a second circuit part biased from a higher voltage supply VCC_UPP;
   at least one of the first and second circuit parts having an RS flip-flop I2, I3 with complementary signal outputs, and the other of said first and second circuit parts having a signal input IN;
   a first switching transistor M1 with a gate connected to the signal input IN and a second switching transistor M2 with a gate connected to the signal input IN through an inverter I1;
   the first and second switching transistors each having a current channel DC coupled in series with a respective cascode-connected transistor connected to a respective one of the signal outputs, one of said outputs being coupled with said input through a first feed-forward AC series circuit of an inverter I4 and a first coupling capacitor C1, and the other of said outputs being coupled with said signal input IN through a second feed-forward AC circuit including a second coupling capacitor C2.

2. The circuit device of claim 1, wherein the second feed-forward AC circuit includes two inverters series-connected with each other and with the second coupling capacitor.

3. The circuit device of claim 1, wherein each of said outputs is connected to an interconnection node of a complementary transistor pair connected in series between first and second supply terminals of a respective supply voltage, each complementary transistor pair having a first transistor with a gate connected to the first supply terminal and a second transistor with a gate connected to the second supply terminal.

* * * * *